(12) United States Patent
Zhang et al.

(10) Patent No.: US 12,385,157 B1
(45) Date of Patent: Aug. 12, 2025

(54) PREPARATION METHOD AND USE OF TWO-DIMENSIONAL MoS2 MATERIALS

(71) Applicant: University of Science and Technology Beijing, Beijing (CN)

(72) Inventors: Yue Zhang, Beijing (CN); He Jiang, Beijing (CN); Zheng Zhang, Beijing (CN); Xiankun Zhang, Beijing (CN); Kuanglei Chen, Beijing (CN); Xiaoyu He, Beijing (CN); Yihe Liu, Beijing (CN); Ruishan Li, Beijing (CN); Yu Geng, Beijing (CN); Chao Chen, Beijing (CN)

(73) Assignee: University of Science and Technology Beijing, Beijing (CN)

( * ) Notice: Subject to any disclaimer, the term of this patent is extended or adjusted under 35 U.S.C. 154(b) by 0 days.

(21) Appl. No.: 19/180,342

(22) Filed: Apr. 16, 2025

(30) Foreign Application Priority Data

Apr. 23, 2024 (CN) .......................... 202410489372.9

(51) Int. Cl.
*C30B 25/00* (2006.01)
*C01G 39/06* (2006.01)
(Continued)

(52) U.S. Cl.
CPC ................ *C30B 9/00* (2013.01); *C01G 39/06* (2013.01); *C23C 16/305* (2013.01); *C30B 25/00* (2013.01);
(Continued)

(58) Field of Classification Search
CPC .............. C23C 16/305; C23C 14/0623; H01L 21/02568; C30B 23/02; C30B 29/46; C30B 25/10
See application file for complete search history.

(56) References Cited

U.S. PATENT DOCUMENTS

2016/0308006 A1 10/2016 Park et al.
2020/0357635 A1* 11/2020 Xu ...................... C23C 14/3435
(Continued)

FOREIGN PATENT DOCUMENTS

CN 103952682 A 7/2014
CN 106048556 A 10/2016
(Continued)

OTHER PUBLICATIONS

English computer translation of CN 117802476 (Year: 2025).*
(Continued)

*Primary Examiner* — Matthew J Song
(74) *Attorney, Agent, or Firm* — Pilloff Passino & Cosenza LLP; Rachel K. Pilloff; Sean A. Passino

(57) ABSTRACT

A preparation method and a use of 2D $MoS_2$ materials are provided. Molybdenum source and sulfur powder are used as raw materials, and inert gas is used as carrier gas. Through an intermediate evaporation process, the raw materials are transported to the molten glass surface and deposited into solid molybdenum sulfide. In the subsequent etching-spreading-sulfurization-precipitation process, ultra-high quality and ultra-large area $MoS_2$ single-crystal domains are obtained under normal pressure and without hydrogenation. The single-crystal domain size of the prepared 2D $MoS_2$ material can reach 1.5 cm, and then grow into a wafer-level 2D $MoS_2$ material with a size of 2 inches and a thickness of 1-2 layers.

4 Claims, 9 Drawing Sheets

(51) Int. Cl.
  *C23C 16/30* (2006.01)
  *C30B 9/00* (2006.01)
  *C30B 29/46* (2006.01)
(52) U.S. Cl.
  CPC .......... *C30B 29/46* (2013.01); *C01P 2002/20* (2013.01); *C01P 2002/60* (2013.01); *C01P 2004/04* (2013.01)

(56) References Cited

U.S. PATENT DOCUMENTS

2022/0399353 A1* 12/2022 Kwak ................ H10D 30/6891
2023/0175122 A1*  6/2023 Park .................... C23C 18/1216
                                                                427/255.31

FOREIGN PATENT DOCUMENTS

| CN | 110172736 | A |   | 8/2019  |              |
|----|-----------|---|---|---------|--------------|
| CN | 111285402 | A |   | 6/2020  |              |
| CN | 117802476 | A | * | 4/2024  | ...... C23C 16/30 |
| CN | 118390158 | B | * | 3/2025  | ...... C30B 25/00 |

OTHER PUBLICATIONS

Notice of first Office action dated Dec. 13, 2024 in SIPO application No. 202410489372.9.
Retrieval report-First search dated Dec. 10, 2024 in SIPO application No. 202410489372.9.
Notification to Grant Patent Right for Invention dated Jan. 28, 2025 in SIPO application No. 202410489372.9.
Shisheng Li et al., Wafer-scale and deterministic patterned growth of monolayer MoS2 via vapor-liquid-solid method Nanoscale, vol. 11 (34), Aug. 5, 2019, pp. 16122-16129 doi: 10.1039/C9NR04612G Claims involved: 1-9.

* cited by examiner

PREPARATION METHOD AND USE OF TWO-DIMENSIONAL MoS2 MATERIALS

CROSS-REFERENCE TO RELATED APPLICATIONS

This application claims priority to Chinese Patent Application No. 202410489372.9, filed on Apr. 23, 2024, the contents of which are hereby incorporated by reference.

TECHNICAL FIELD

The disclosure belongs to the technical field of two-dimensional (2D) material preparation, and more specifically relates to a preparation method and a use of 2D $MoS_2$ materials.

BACKGROUND

Since the 2D materials were produced by mechanical exfoliation in 2004, 2D transition metal dichalcogenides (2D TMDCs) with atomic thickness and excellent physical properties have been widely reported, and are expected to be a promising candidate for the post-Moore's Law era. The preparation of high-quality large-area and large-scale 2D TMDCs is the cornerstone to realize its large-scale application in integrated circuits (ICs). The methods of preparing 2D materials include mechanical exfoliation, liquid-phase exfoliation, physical vapor deposition (PVD), chemical vapor deposition (CVD) et. al. Growth methods are usually classified into top-down and bottom-up approaches. Although the approaches of top-down mechanical exfoliation have made breakthrough, their industrial prospect still have a long way to go. The bottom-up growth methods have been studied a lot. Among them, CVD is considered to be the most suitable method for industrialized 2D materials.

All guided by the CVD growth mechanism, there have been significant advancements in precursor selection, precise control of the mass transfer process, investigation of catalyst mechanisms, and substrate engineering in recent years, which are used to modify the substrate surface. At present, there are three modes for 2D TMDCs growth at large scale: i) randomly splicing; ii) single nucleation growth; iii) seamless stitching. Due to the progress in substrate engineering in recent years, single-crystal 2D $MoS_2$ has successfully achieved a 2-inch scale through unidirectional growth. In addition, the randomly spliced polycrystal 2D $MoS_2$ has reached the size of 12 inches.

At present, the wafer size single-crystal 2D TMDC growth by the CVD is all achieved by merging crystal domains. However, the translational grain boundary caused by imperfect stitching still exists, which reduces the application value for the device. In contrast, growing isolated crystal domains can avoid the boundary caused by stitching. However, so far, only three works have achieved the growth of millimeter-scale isolated crystal domains, which are 2.6 millimeters (mm), 1.1 mm and 1.0 mm, respectively. The isolated crystal domains cannot break through the limitation of large-scale growth.

The growth of large-scale isolated single-crystal $MoS_2$ depends on the control of three factors: minimizing the density of nucleation sites, maintaining lateral growth and inhibiting vertical growth. The three factors mean that high nucleation energy barrier and low diffusion energy barrier are needed in the growth process of the large-scale isolated single-crystal $MoS_2$. However, the best conditions to realize the three factors at the same time will bring challenges.

Compared with the growth of 2D materials, the manufacturing of high-quality single-crystal block materials is similar to the Czochralski process, which usually begins with the growth from a seed rather than through the splicing of multiple crystals. The process of seed growth requires large-scale and uniform liquid or solid precursors. Low nucleation density and lateral growth can be maintained by controlled Czochralski process. However, the liquid precursor in Czochralski process is difficult to be confined in 2D space, so the vertical growth can not be controlled.

SUMMARY

The disclosure aims to provide a preparation method and a use of 2D $MoS_2$ materials. $MoO_3$ powder and sulfur powder are used as raw materials, and inert gas is used as a carrier gas. Through an intermediate evaporation process, the raw materials are transported to a molten glass surface to be deposited as solid molybdenum sulfide, and in the subsequent etching spreading-sulfurization precipitation process, ultra-high quality and ultra-large area $MoS_2$ single-crystal domains grown under normal pressure and without hydrogenation are obtained, so as to solve the problems existing in the prior art.

To achieve the above objectives, the present disclosure provides following schemes.

One of the technical schemes of the disclosure is to provide a preparation method of 2D $MoS_2$ materials, including following steps:

using molybdenum source and sulfur as raw materials, using inert gas as carrier gas, transporting the raw materials to a molten sodium-calcium glass surface to deposit solid molybdenum sulfide through an intermediate evaporation process, and obtaining the 2D $MoS_2$ materials by etching, spreading, sulfurization and precipitation.

In an embodiment, the molybdenum source is one of $MoO_3$, sodium molybdate, molybdenum sulfide and molybdenum foil.

In an embodiment, the dosage of the molybdenum source is 1 milligram (mg) to 20 mg.

In an embodiment, the sulfur is sublimated sulfur.

In an embodiment, the step of transporting the raw materials to the molten sodium-calcium glass surface to deposit the solid molybdenum sulfide through the intermediate evaporation process specifically includes following steps:

placing the sulfur in a first temperature zone and the molybdenum source and the sodium-calcium glass in a second temperature zone; and heating the first temperature zone to 120-180 degrees Celsius (° C.), heating the second temperature zone to 500-1400° C., introducing the inert gas in a heating process, transporting the sulfur to the second temperature zone by the inert gas, and depositing on the sodium-calcium glass surface to obtain a solid molybdenum sulfide layer.

Optionally, a heating rate of the first temperature zone is 5-50 degrees Celsius per minute (° C./min); a heating rate of the second temperature zone is 5-50° C./min.

Optionally, the inert gas is argon, and a flow rate is 200-500 standard cubic centimeter per minute (sccm).

In an embodiment, specific steps of the etching and the spreading are as follows: after obtaining the solid molybdenum sulfide layer, adjusting a temperature of the second temperature zone to 900-1400° C., introducing oxygen, and etching the solid molybdenum sulfide layer to obtain a $Na_2Mo_2O_7$ precursor.

Optionally, a flow rate of the oxygen is 1-10 sccm.

Optionally, a temperature adjustment rate of the second temperature zone is 0-50° C./min.

The etching and the spreading in the present disclosure includes two steps. Molybdenum oxide generated by oxygen etching the pre-deposited $MoS_2$ solid reacts with $Na_2O$ in the glass to generate a non-volatile $Na_2Mo_2O_7$ precursor. The $Na_2Mo_2O_7$ precursor spreads and converges on the surface of the molten glass, the tension in the liquid is destroyed, and finally the spreading of the 2D film is completed.

In an embodiment, specific steps of the sulfurization and precipitation are as follows: after obtaining the $Na_2Mo_2O_7$ precursor, stopping oxygen supply and carrying out sulfurization and precipitation reaction to obtain the 2D $MoS_2$ materials.

It should be noted that if oxygen is introduced for a long time, all molybdenum sources will be etched and escape with the carrier gas, and $MoS_2$ will not grow on the glass surface. Therefore, the time of oxygen introduction should be strictly controlled, and the oxygen supply should be stopped immediately when the solid molybdenum sulfide layer is transformed into sodium molybdate precursor.

The disclosure utilizes the liquid-liquid interface diffusion growth mechanism of 2D $MoS_2$ material assisted by molten glass, obtains a liquid molybdenum oxide film with the assistance of liquid glass at high temperature, and then obtains a large-size $MoS_2$ single-crystal domain at an ultra-fast speed through the sulfurization process. Specifically, in the pre-deposition step, sulfur vapor reacts with a sublimated molybdenum source to deposit solid molybdenum sulfide on the molten sodium-calcium glass surface (at this time, the molybdenum sulfide layer is thick, and not 2D structure), then oxygen is used as an etchant to react with the generated molybdenum sulfide and $Na_2O$ in sodium-calcium glass to generate a $Na_2Mo_2O_7$ precursor. Because sodium-calcium glass is in a molten state and is a high-tension liquid, the surface low-tension $Na_2Mo_2O_7$ precursor is spread to obtain a 2D liquid precursor film, and finally 2D $MoS_2$ materials are obtained through the sulfurization and precipitation processes of supersaturated sulfur vapor in the sulfurization process. Because the 2D liquid precursor is very thin, the precipitation process in this process is extremely fast, reaching 75 micrometres per second ($\mu$m/s).

The second technical scheme of the present disclosure is to provide 2D $MoS_2$ materials prepared by the above preparation method.

The third technical scheme of the present disclosure is to provide a use of the 2D $MoS_2$ materials in a field effect transistors (FETs).

The disclosure discloses following technical effects.

The disclosure can effectively improve the crystallization quality through the growth in the high-temperature liquid-solid crystallization process, and the prepared 2D $MoS_2$ material has a large area, and the side length of centimeter-level crystal domains can reach 1.5 centimeters (cm), and multiple crystal domains can cover a five-inch glass surface (wafer level), with a thickness of 1-2 layers and a defect density of less than $1.0\times10^{13}$ $cm^{-2}$, which is helpful to improve its use performance in large-scale, high yield, high performance and low power consumption integrated circuits, optoelectronics and other fields.

The preparation material of the present disclosure is grown under normal pressure, which can occur without vacuumizing equipment, and the reaction under normal pressure is very rapid, and the preparation efficiency is high, which can reach 75 $\mu$m/s.

BRIEF DESCRIPTION OF THE DRAWINGS

The attached drawings, which constitute a part of this disclosure, are used to provide a further understanding of this disclosure. The illustrative embodiments and descriptions of this disclosure are used to explain this disclosure, and do not constitute an improper limitation of this disclosure. In the attached drawings.

DETAILED DESCRIPTION OF THE EMBODIMENTS

A number of exemplary embodiments of the present disclosure will now be described in detail, and this detailed description should not be considered as a limitation of the present disclosure, but should be understood as a more detailed description of certain aspects, characteristics and embodiments of the present disclosure.

It should be understood that the terminology used in the present disclosure is only for describing specific embodiments and is not used for limiting the present disclosure. In addition, for the numerical range in the present disclosure, it should be understood that each intermediate value between the upper limit and the lower limit of the range is also specifically disclosed. Intermediate values within any stated value or stated range, as well as each smaller range between any other stated value or intermediate values within the stated range are also included in the present disclosure. The upper and lower limits of these smaller ranges can be included or excluded independently.

Unless otherwise specified, all technical and scientific terms used herein have the same meaning as commonly understood by one of ordinary skill in the art to which this disclosure relates. Although the present disclosure only describes the preferred methods and materials, any methods and materials similar or equivalent to those described herein can also be used in the practice or testing of the present disclosure. All documents mentioned in this specification are incorporated by reference to disclose and describe methods and/or materials related to the documents. In case of conflict with any incorporated document, the contents of this specification shall prevail.

It is obvious to those skilled in the art that many improvements and changes can be made to the specific embodiments of the present disclosure without departing from the scope or spirit of the present disclosure. Other embodiments obtained from the description of the present disclosure are obvious to the skilled person. The description and embodiment of the present disclosure are exemplary only.

The terms "including", "comprising", "having" and "containing" used herein are all open terms, which means including but not limited to.

Unless otherwise specified, the room temperature and normal temperature in the specific embodiment of the present disclosure are both 20-30 degrees Celsius (° C.).

In a specific embodiment of the present disclosure, the inert gas is argon.

Figure 1:
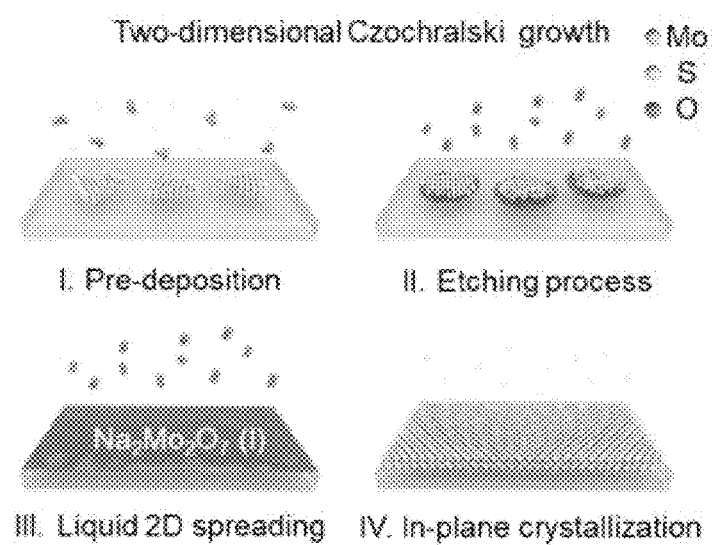
FIG. 1 is a schematic diagram of the growth of 2D $MoS_2$.

FIG. 1 is a schematic diagram of the growth of 2D $MoS_2$.

Figure 2:
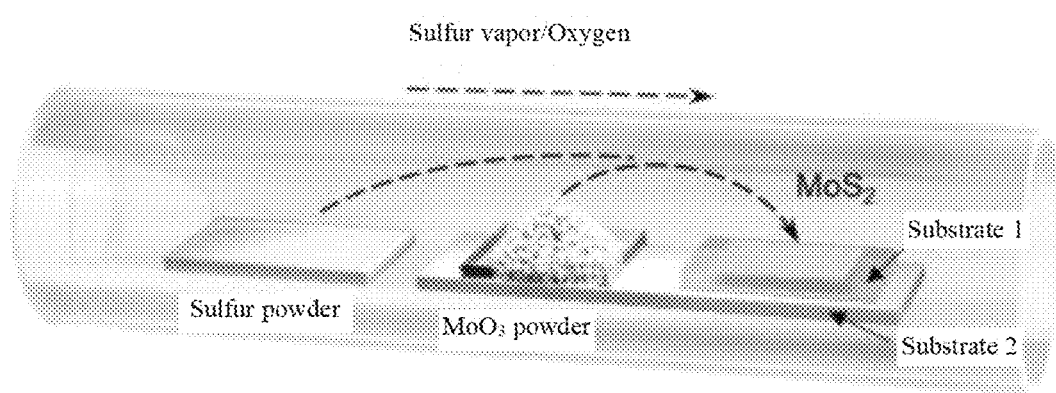
FIG. 2 is a flow chart of the preparation of the 2D $MoS_2$ material of the present disclosure, where the substrate 1 is sodium-calcium glass and the substrate 2 is wafer.

FIG. 2 is a flow chart of the preparation of the 2D $MoS_2$ material of the present disclosure, where the substrate 1 is sodium-calcium glass and the substrate 2 is a wafer.

Embodiment 1

The preparation steps of the centimeter-level 2D $MoS_2$ single-crystal domain material are as follows.

S1, treatment of growth substrate: the sodium-calcium glass surface is ultrasonically cleaned with acetone, isopropanol and water for 5 minutes (min), respectively, and then the glass substrate with clean surface is obtained by oxygen ion etching after being dried by nitrogen;

S2, oven drying and inert gas protection: heating the tube furnace to 500° C. for heat preservation, and introducing inert protective gas to expel air;

S3, double-temperature zone heating growth: putting sublimated sulfur in the first temperature zone, pushing 5 mg of $MoO_3$ powder and sodium-calcium glass in the second temperature zone in turn (sodium-calcium glass is set off by wafer, in order to keep the shape of sodium-calcium glass at high temperature), the distance between molybdenum source and sodium-calcium glass is about 12-15 cm, and heating the first temperature zone to 130° C. at a heating rate of 50 degrees Celsius per minute (° C./min). Heating the second temperature zone to 1000° C. at a heating rate of 20° C./min, transporting the sublimated sulfur in the first temperature zone to the second temperature zone in the form of steam under the flow of inert gas (100 standard cubic centimeter per minute (sccm)), and depositing on the sodium-calcium glass surface to obtain a solid molybdenum sulfide layer;

S4, after obtaining a solid molybdenum sulfide layer, introducing oxygen (1-10 sccm) at 1000° C., and etching the solid molybdenum sulfide layer to obtain a $Na_2Mo_2O_7$ precursor; and S5, after obtaining the $Na_2Mo_2O_7$ precursor, stopping oxygen supply, carrying out sulfurization and precipitation reaction, and cooling to room temperature to obtain the centimeter-level 2D $MoS_2$ material.

Figure 3:
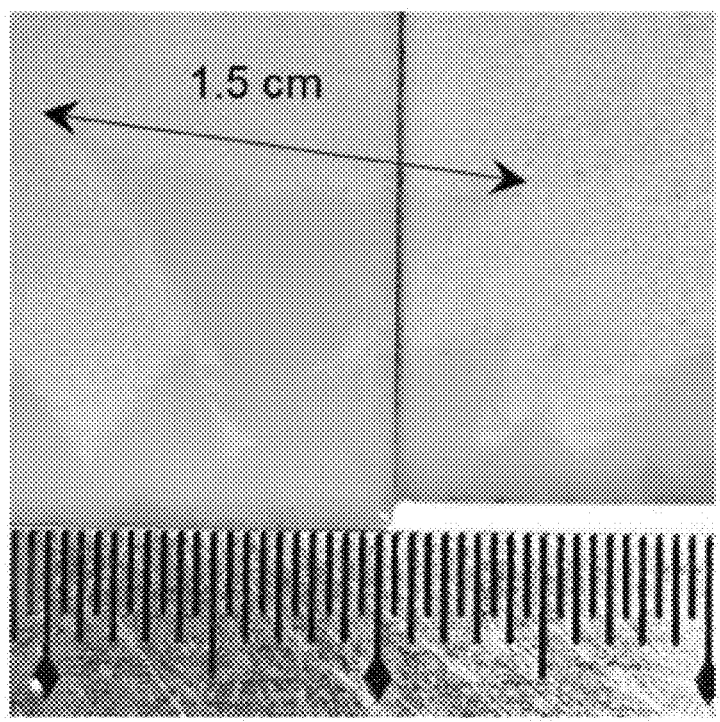
FIG. 3 is a single-crystal domain size diagram of the 2D $MoS_2$ material prepared in Embodiment 1.
Figure 4:
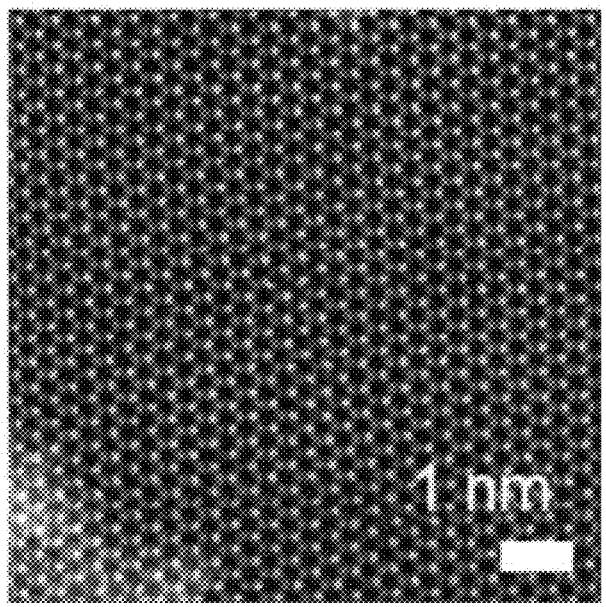
FIG. 4 is a scanning tunneling microscope diagram of the 2D $MoS_2$ prepared in Embodiment 1.

The single-crystal domain size diagram of the centimeter-level 2D $MoS_2$ material prepared in S5 step is shown in FIG. 3; and the scanning tunneling microscope (STM) diagram of the centimeter-level 2D $MoS_2$ material prepared in S5 step is shown in FIG. 4, where the bright spots are molybdenum atoms (Mo) and the dark spots are sulfur atoms(S).

Embodiment 2

The preparation steps of the double-layer 2D $MoS_2$ material are as follows.

S1, treatment of growth substrate: the sodium-calcium glass surface is ultrasonically cleaned with acetone, isopropanol and water for 5 min, respectively, and then the glass substrate with clean surface is obtained by oxygen ion etching after being dried by nitrogen;

S2, oven drying and inert gas protection: heating the tube furnace to 500° C. for heat preservation, and introducing inert protective gas to expel air;

S3, double-temperature zone heating growth: putting sublimated sulfur in the first temperature zone, pushing 8 mg of $MoO_3$ powder and sodium-calcium glass in the second temperature zone in turn (sodium-calcium glass is set off by wafer, in order to keep the shape of sodium-calcium glass at high temperature), the distance between molybdenum source and sodium-calcium glass is about 12-15 cm, and heating the first temperature zone to 160° C. at a heating rate of 50° C./min. Heating the second temperature zone to 1000° C. at a heating rate of 20° C./min, transporting the sublimated sulfur in the first temperature zone to the second temperature zone in the form of steam under the flow of inert gas (150 sccm), and depositing on the sodium-calcium glass surface to obtain a solid molybdenum sulfide layer;

S4, after obtaining a solid molybdenum sulfide layer, introducing oxygen (1-10 sccm) at 1100° C., and etching the solid molybdenum sulfide layer to obtain a $Na_2Mo_2O_7$ precursor; and S5, after obtaining the $Na_2Mo_2O_7$ precursor, stopping oxygen supply, carrying out sulfurization and precipitation reaction, and cooling to room temperature to obtain the centimeter-level 2D $MoS_2$ material.

Figure 5:
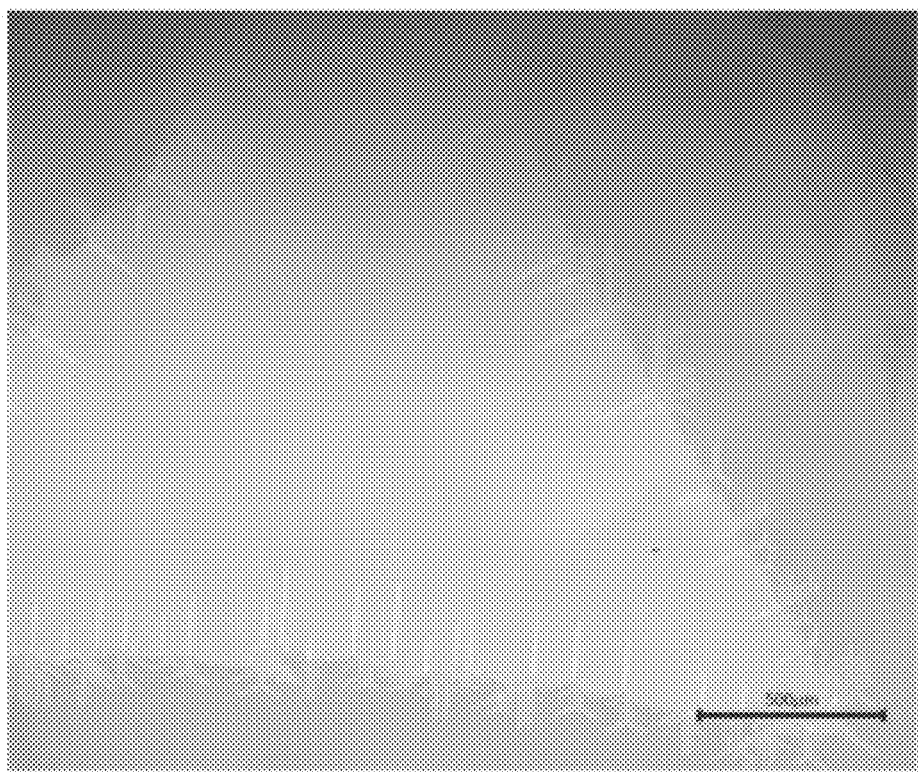
FIG. 5 is a size diagram of the double-layer 2D $MoS_2$ material prepared in Embodiment 2.

The single-crystal domain size diagram of the double-layer 2D $MoS_2$ material prepared in S5 step is shown in FIG. 5.

Embodiment 3

The preparation steps of the wafer-level 2D $MoS_2$ material are as follows.

Figure 6:
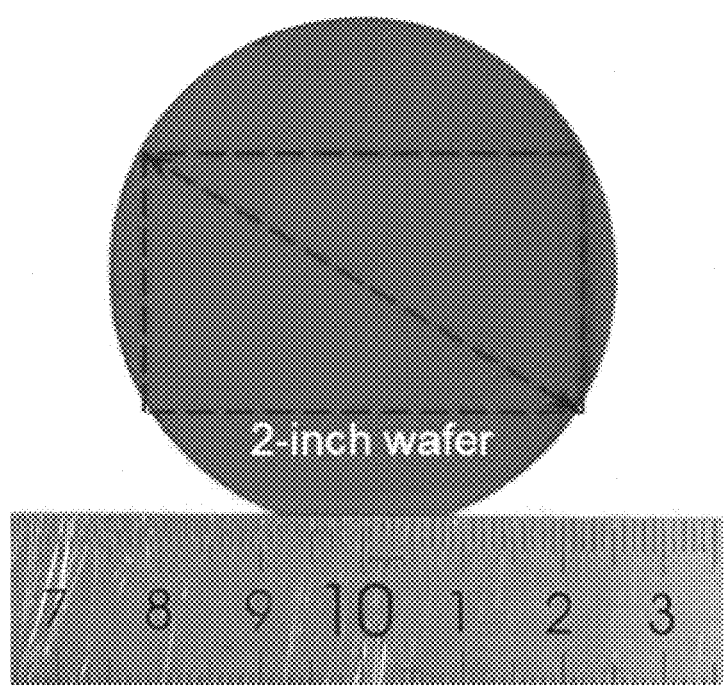
FIG. 6 is a size diagram of the wafer-level 2D $MoS_2$ material prepared in Embodiment 3.

S1, treatment of growth substrate: the sodium-calcium glass surface is ultrasonically cleaned with acetone, isopropanol and water for 5 min, respectively, and then the glass substrate with clean surface is obtained by oxygen ion etching after being dried by nitrogen;

S2, oven drying and inert gas protection: heating the tube furnace to 500° C. for heat preservation, and introducing inert protective gas to expel air;

S3, double-temperature zone heating growth: putting sublimated sulfur in the first temperature zone, pushing 10 mg of $MoO_3$ powder and sodium-calcium glass in the second temperature zone in turn (sodium-calcium glass is set off by wafer, in order to keep the shape of sodium-calcium glass at high temperature), the distance between molybdenum source and sodium-calcium glass is about 12-15 cm, and heating the first temperature zone to 150° C. at a heating rate of 50° C./min. Heating the second temperature zone to 1100° C. at a heating rate of 20° C./min, transporting the sublimated sulfur in the first temperature zone to the second temperature zone in the form of steam under the flow of inert gas (100 sccm), and depositing on the sodium-calcium glass surface to obtain a solid molybdenum sulfide layer;

S4, after obtaining a solid molybdenum sulfide layer, introducing oxygen (1-10 sccm) at 1100° C., and etching the solid molybdenum sulfide layer to obtain a $Na_2Mo_2O_7$ precursor; and S5, after obtaining the $Na_2Mo_2O_7$ precursor, stopping oxygen supply, carrying out sulfurization and precipitation reaction, and cooling to room temperature to obtain the centimeter-level 2D $MoS_2$ material. After the wafer-level 2D $MoS_2$ material is transferred to a wafer, the sizes are measured, as shown in FIG. 6.

Embodiment 4

The only difference from Embodiment 1 is that $MoO_3$ powder is replaced by molybdenum sulfide, sodium molybdate or molybdenum foil with the same mass.

Figure 7:
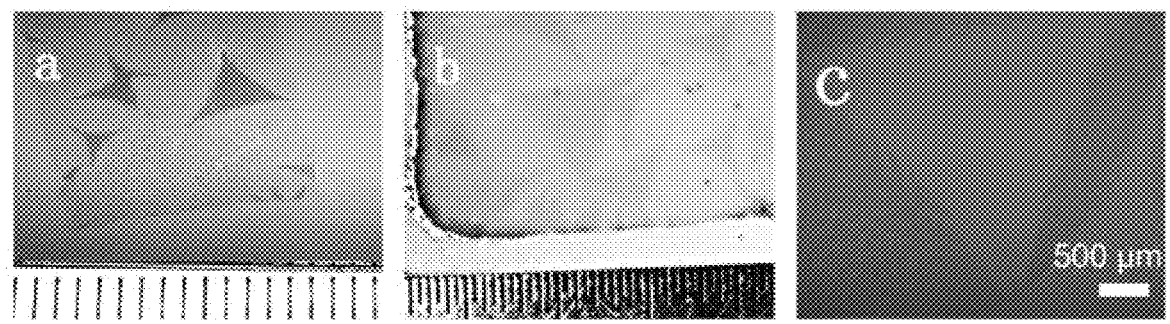
FIG. 7 is a single-crystal domain size diagram of a 2D $MoS_2$ material prepared from molybdenum sulfide, sodium molybdate or molybdenum foil, where a is molybdenum sulfide, b is sodium molybdate and c is molybdenum foil.

FIG. 7 is a single-crystal domain size diagram of a 2D $MoS_2$ material prepared from molybdenum sulfide, sodium molybdate or molybdenum foil, where a is molybdenum sulfide, b is sodium molybdate and c is molybdenum foil.

Comparative Embodiment 1

The steps of preparing 2D $MoS_2$ by conventional CVD are as follows.

S1, the precursor is evaporated/sublimated into gas at high temperature and transported to the substrate area under the action of carrier gas.

S2, on the surface of the substrate, at first, some precursor gas molecules break through the adsorption potential barrier and are adsorbed on the surface of the glass substrate, and then break through the nucleation barrier to undergo chemical reaction to obtain nucleation. At the same time, a part of gas molecules is desorbed and leave the substrate surface.

S3, after the nucleation is completed, the precursor continues to grow near the nucleation point in two ways: 1. breaking through E1 and directly adsorbing on the edge of the nucleation point, and completing the bonding and growth along the edge; 2. breaking through E2 and firstly adsorbing on the substrate surface, and then completing aggregation, bonding and growth at the edge of nucleation point through diffusion on the substrate surface. In fact, E1 is much larger than E2, so the adsorption and diffusion on the substrate surface are very important factors affecting the growth of 2D materials.

Figure 8:
FIG. 8 is a single-crystal domain size diagram of 2D $MoS_2$ prepared in Comparative Embodiment 1.

FIG. 8 is a single-crystal domain size diagram of 2D $MoS_2$ prepared in Comparative Embodiment 1. As can be seen from FIG. 8, the 2D $MoS_2$ material prepared by this method has a small area with a size side length of only 2.6 mm, which is quite different from that prepared in Embodiment 1 of this disclosure.

Comparative Embodiment 2

The steps of splicing micron-sized particles to synthesize a pseudo-single-crystal TMDCs wafer with a large number of crystal boundaries are as follows.

S1, by increasing the mass flux greatly, the nucleation barrier is broken, and a large number of nucleation sites are gathered on the substrate surface.

S2, using high-quality flux to break through the diffusion barrier and complete the growth of a large number of micron-sized crystal domains on the substrate surface.

S3, when the micron-sized crystal domains grow to be in contact with the adjacent domains, the randomly oriented crystal domains will generate crystal boundaries during the splicing process.

Figure 9:
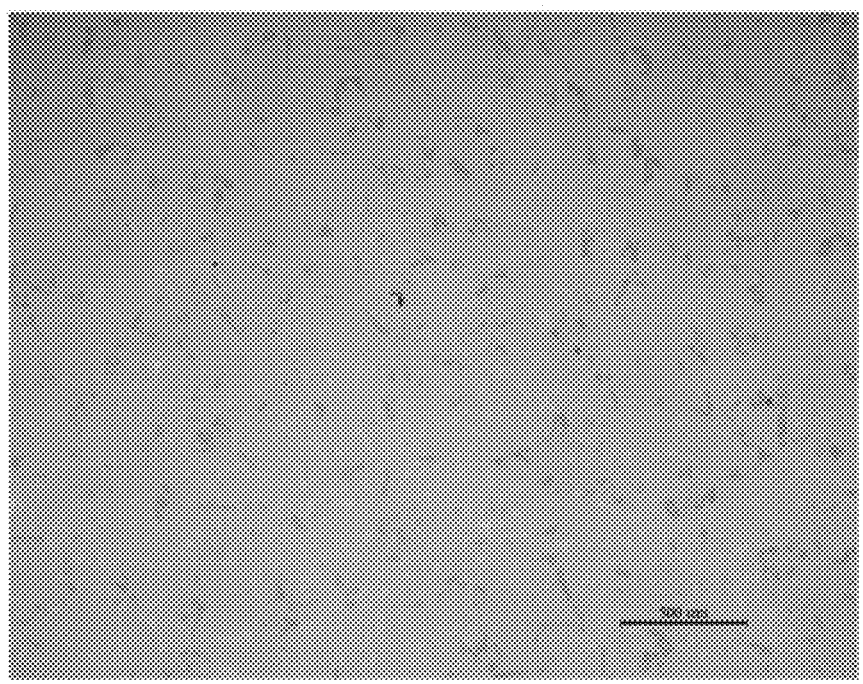
FIG. 9 is a single-crystal domain size diagram of a pseudo-single-crystal TMDCs wafer prepared in Comparative Embodiment 2.

FIG. 9 is a single-crystal domain size diagram of the pseudo-single-crystal TMDCs wafer prepared in Comparative Embodiment 2. As can be seen from FIG. 9, there are obvious crystal boundaries in the crystal domain of the pseudo-single-crystal TMDCs wafer prepared in Comparative Embodiment 2, thus affecting the stability as a channel material.

By improving the growth method and controlling the growth conditions, the defect density of the prepared material is lower than $1.0 \times 10^{13}$ $cm^{-2}$, and low defect density means high uniformity and stability of the material, which is beneficial to the preparation of large-scale high-quality integrated circuits.

In this disclosure, the transfer mode of molybdenum source is as follows: after sublimation, molybdenum sulfide solid is carried away by carrier gas to complete the gas-solid process, after oxygen is introduced, the solid-liquid process is completed; and after stopping oxygen supply, the liquid-solid process is completed to form 2D $MoS_2$. Under the condition of increasing the amount of molybdenum source, more competition will occur between crystal domains, and the final product will be a wafer-level crystal domain splicing film, so that the substrate surface is fully spliced with splicing films, and when the dosage is low, a centimeter-level single-crystal domain is formed.

The various embodiments in this specification are described in a progressive way, and each embodiment focuses on the differences from other embodiments, and the same and similar parts among the embodiments can only be referred to each other.

The above description of the disclosed embodiments enables those skilled in the art to make or use the disclosure. Many modifications to these embodiments will be obvious to those skilled in the art, and the general principles defined herein can be implemented in other embodiments without departing from the spirit or scope of the disclosure. Therefore, the present disclosure is not to be limited to the embodiments shown herein, but is to be accorded the widest scope consistent with the principles and novel features disclosed herein.

What is claimed is:

1. A preparation method of 2D $MoS_2$ materials, comprising following steps:

using molybdenum source and sulfur as raw materials, using inert gas as carrier gas, transporting the raw materials to a molten sodium-calcium glass surface to deposit solid molybdenum sulfide through an intermediate evaporation process, and obtaining the 2D $MoS_2$ materials by etching, spreading, sulfurization and precipitation;

the step of transporting the raw materials to the molten sodium-calcium glass surface to deposit the solid molybdenum sulfide through the intermediate evaporation process comprises: placing the sulfur in a first temperature zone and placing the molybdenum source and the sodium-calcium glass in a second temperature zone; and heating the first temperature zone to 120-180° C., heating the second temperature zone to 500-1400° C., introducing the inert gas in a heating process, transporting the sulfur to the second temperature zone by the inert gas, and depositing on the sodium-calcium glass surface to obtain a solid molybdenum sulfide layer;

steps of the etching and the spreading are: after obtaining the solid molybdenum sulfide layer, adjusting a temperature of the second temperature zone to 900-1400° C., introducing oxygen, and etching the solid molybdenum sulfide layer to obtain $Na_2Mo_2O_7$, and steps of the sulfurization and precipitation are: after obtaining the $Na_2Mo_2O_7$, stopping oxygen supply and carrying out a sulfurization and precipitation reaction to obtain the 2D $MoS_2$ materials.

2. The preparation method according to claim 1, wherein in a process of depositing to obtain the solid molybdenum sulfide layer, a heating rate of the first temperature zone is 5-50° C./min; a heating rate of the second temperature zone is 5-50° C./min; and the inert gas is argon, and a flow rate is 200-500 sccm.

3. The preparation method according to claim 1, wherein in a process of the etching and the spreading, a flow rate of the oxygen is 1-10 sccm; and a temperature adjustment rate of the second temperature zone is 0-50° C./min.

4. The preparation method according to claim 1, wherein the sulfur is sublimated sulfur; the molybdenum source is one of $MoO_3$, sodium molybdate, molybdenum sulfide and molybdenum foil; and a dosage of the molybdenum source is 1 mg to 20 mg.

* * * * *